US010373988B2

(12) United States Patent
Wang et al.

(10) Patent No.: US 10,373,988 B2
(45) Date of Patent: Aug. 6, 2019

(54) DISPLAY SUBSTRATE, MANUFACTURING METHOD THEREOF, AND DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan Province (CN)

(72) Inventors: Yang Wang, Beijing (CN); Ting Li, Beijing (CN); Pengcheng Zang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 28 days.

(21) Appl. No.: 15/723,499

(22) Filed: Oct. 3, 2017

(65) Prior Publication Data
US 2018/0211982 A1 Jul. 26, 2018

(30) Foreign Application Priority Data
Jan. 25, 2017 (CN) .......................... 2017 1 0061143

(51) Int. Cl.
*H01L 27/12* (2006.01)
*G02F 1/1362* (2006.01)
(Continued)

(52) U.S. Cl.
CPC .... *H01L 27/1244* (2013.01); *G02F 1/136259* (2013.01); *G02F 1/136286* (2013.01);
(Continued)

(58) Field of Classification Search
CPC ............. H01L 27/1244; H01L 27/3276; H01L 27/3223; H01L 27/1248; H01L 27/1262; G02F 1/136286
See application file for complete search history.

(56) References Cited

U.S. PATENT DOCUMENTS

2003/0179334 A1 9/2003 Kang et al.
2005/0139841 A1 6/2005 Park

FOREIGN PATENT DOCUMENTS

| CN | 1445594 A | 10/2003 | |
| CN | 202600314 U | 12/2012 | |
| CN | 104834143 A | * 8/2015 | ....... G02F 1/133345 |

OTHER PUBLICATIONS

First Office Action for Chinese Application No. 201710061143.7, dated Jan. 28, 2019, 7 Pages.

* cited by examiner

*Primary Examiner* — Syed I Gheyas
(74) *Attorney, Agent, or Firm* — Brooks Kushman P.C.

(57) ABSTRACT

A display substrate, a manufacturing method thereof, and a display panel are provided. The display substrate includes a base substrate, a display region on the base substrate and a wiring region surrounding the display region. The wiring region includes at least one signal line and at least one dummy line arranged parallel to the signal line. A distance between a surface of the dummy line away from the base substrate and the base substrate is greater than a distance between a surface of the signal line away from the base substrate and the base substrate. The dummy line is arranged along the signal line, and the distance between the surface of the dummy line and the base substrate is larger than the distance between the surface of the signal line and the base substrate, i.e., a height of the signal line is greater than a height of the signal line.

13 Claims, 6 Drawing Sheets

(51) Int. Cl.
*H01L 27/32* (2006.01)
*G02F 1/1333* (2006.01)
(52) U.S. Cl.
CPC ...... *H01L 27/1248* (2013.01); *H01L 27/1262* (2013.01); *H01L 27/3223* (2013.01); *H01L 27/3276* (2013.01); *G02F 1/133351* (2013.01); *G02F 2001/13629* (2013.01); *G02F 2201/50* (2013.01)

DISPLAY SUBSTRATE, MANUFACTURING METHOD THEREOF, AND DISPLAY PANEL

CROSS-REFERENCE TO RELATED APPLICATION

This application claims priority to Chinese Patent Application No. 201710061143.7 filed on Jan. 25, 2017, which is incorporated herein by reference in its entirety.

TECHNICAL FIELD

The present disclosure relates to a display substrate, a manufacturing method thereof, and a display panel.

BACKGROUND

Flat-panel display has been developed rapidly over recent decades and has attracted more and more attention. A more advanced manufacture technology needs to be adopted by manufacturers, so as to simplify a manufacture process, reduce the manufacture cost and improve the yield, thereby to improve their competitiveness. However, during the manufacture of a display panel, after a cutting process, a color filter substrate above signal lines at a peripheral region of an array substrate may be cut off, and at this time, the peripheral region of the array substrate may be exposed for the subsequent operation. The signal lines at the peripheral region function as to transmit signals from a driving circuit to a display region, so as to turn on or off thin film transistor (TFT) switches in each row and charge pixels in each column. However, usually these signal lines are merely protected by a passivation layer.

After the cutting processing, there are some manufacture processes and check procedures. During the actual manufacture, these signal lines may probably be scratched or cut off, and at this time, a defective display effect may occur and the yield may be adversely affected. Especially in the case that the signal lines at the peripheral region are arranged at two layers, the signal lines formed by a source/drain electrode layer are arranged at a level higher than, e.g., by 220 nm, the signal lines formed by a gate electrode layer, so the signal lines formed by the source/drain electrode layer are usually scratched at first. In addition, the signal lines formed by the source/drain electrode layer are covered merely by the passivation layer, so they may be cut off more easily. Hence, the defective display effect may occur and the yield may be adversely affected.

SUMMARY

An object of the present disclosure is to provide a display substrate, a manufacturing method and a display panel, so as to overcome the above-mentioned defects. During the manufacture of the display panel, a dummy line is arranged along each signal line at a level higher than the signal line. During a cutting process, the dummy line may be cut at first, so as to protect the signal line.

In one aspect, the present disclosure provides in some embodiments a display substrate, including a base substrate, a display region on the base substrate and a wiring region surrounding the display region. The wiring region includes at least one signal line and at least one dummy line arranged along the signal line. A distance between a surface of the dummy line away from the base substrate and the base substrate is greater than a distance between a surface of the signal line away from the base substrate and the base substrate.

Optionally, an orthogonal projection of the dummy line onto the base substrate at least partially overlaps an orthogonal projection of the signal line onto the base substrate.

Optionally, the display region includes at least one of a gate electrode layer, an active layer, a source/drain electrode layer and a pixel electrode layer on the base substrate.

Optionally, the dummy line is arranged at a layer identical to, and insulated from, at least one of the active layer, the pixel electrode layer and the source/drain electrode layer.

Optionally, the signal line includes at least one of a gate signal line arranged at a layer identical to, and electrically connected to, the gate electrode layer, and a data signal line arranged at a layer identical to, and electrically connected to, the source/drain electrode layer.

Optionally, an orthogonal projection of the data signal line onto the base substrate is located between orthogonal projections of adjacent gate signal lines onto the base substrate.

Optionally, at least a portion of at least one of the signal lines is provided with at least two branch lines, first end portions of the branch lines are connected to each other, second end portions of the branch lines are connected to each other, portions of the branch lines apart from the end portions are spaced apart from each other, and at least a portion of each dummy line is arranged between two adjacent branch lines.

Optionally, the display substrate further includes an insulation layer arranged between the dummy line and the signal line.

Optionally, the wiring region includes a plurality of signal lines, and the orthogonal projection of each dummy line onto the base substrate is located between orthogonal projections of two adjacent signal lines onto the base substrate.

Optionally, the orthogonal projection of each dummy line onto the base substrate at least partially overlaps the orthogonal projection of the gate signal line onto the base substrate, and the orthogonal projection of each dummy line onto the base substrate is located between the orthogonal projections of the adjacent data signal lines onto the base substrate.

Optionally, the display substrate further includes an insulation layer between the dummy line and the gate signal line, a passivation layer arranged on the insulation layer, the dummy line and the data signal line, and an electrode layer arranged on the passivation layer. A distance between a surface of the electrode layer above the gate signal line away from the base substrate and the base substrate is greater than a distance between a surface of the electrode layer above the data signal line away from the base substrate and the base substrate.

Optionally, at least a portion of at least one of the signal lines is provided with two branch lines connected in parallel. Orthogonal projections of the two branch lines onto the base substrate surround an orthogonal projection of at least a portion of the dummy line onto the base substrate.

In another aspect, the present disclosure provides in some embodiments a display panel including the above-mentioned display substrate.

In yet another aspect, the present disclosure provides in some embodiments a method for manufacturing a display substrate, including steps of: providing a base substrate including a display region and a wiring region surrounding the display region; and forming at least one signal line and at least one dummy line sequentially at the wiring region. The dummy line is formed along the signal line, and a distance between a surface of the dummy line away from the base substrate and the base substrate is greater than a distance between a surface of the signal line away from the base substrate and the base substrate.

Optionally, an orthogonal projection of the dummy line onto the base substrate at least partially overlaps an orthogonal projection of the signal line onto the base substrate.

Optionally, the method further includes forming at least one of a gate electrode layer, an active layer, a source/drain electrode layer and a pixel electrode layer at the display region.

Optionally, the dummy line is arranged at a layer identical to, and formed simultaneously together with, at least one of the active layer, the pixel electrode layer and the source/drain electrode layer.

Optionally, the step of forming the signal line includes forming at least one of a gate signal line arranged at a layer identical to, and electrically connected to, the gate electrode layer and a data signal line arranged at a layer identical to, and electrically connected to, the source/drain electrode layer while forming the gate electrode layer and the source/drain electrode layer.

Optionally, the method further includes forming an insulation layer between the dummy line and the signal line.

Optionally, the wiring region includes a plurality of signal lines, and the orthogonal projection of the dummy line onto the base substrate is located between orthogonal projections of the adjacent signal lines onto the base substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
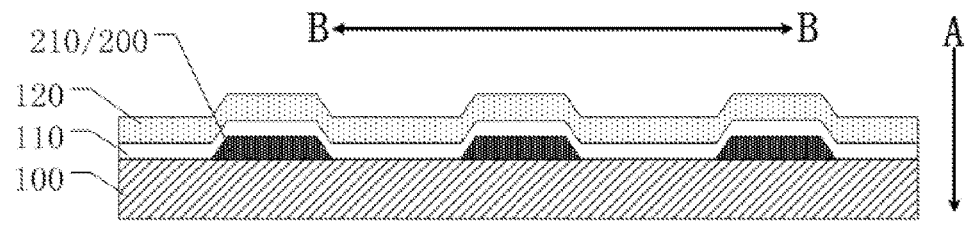
FIG. 1 is a sectional view of a wiring region of a display substrate in the related art.

REFERENCE SIGN LIST 1 display substrate
2 color filter substrate
3 display region
4 peripheral region
5 wiring region
6 sealant
100 base substrate
110 insulation layer
120 passivation layer
200 signal line
210 gate signal line
220 data signal line
300 dummy line
310 first dummy line
320 second dummy line
330 third dummy line
1000 electrode layer

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

During the manufacture of a display substrate, a color filter substrate above a signal line at a peripheral wiring region may be cut off, so as to expose circuits, such as the signal line, at the peripheral wiring region. The signal line may function as to turn on or off a switching element, e.g., a TFT switch, of the display panel and charge a pixel electrode. However, during the cutting process, apart from the cut portion of the color filter substrate, debris may also be dropped onto the wiring region. Usually, merely a passivation layer is arranged above the signal line so as to protect the signal line. The signal line may be scratched or cut-off by such foreign matters as the cut portion of the color filter substrate or the debris, and thereby a defective display effect may occur.

As shown in FIG. 1 which is a sectional view of the wiring region of the display substrate in the related art, signal lines 200 may be arranged at an identical layer, e.g., they may merely include gate signal lines 210 arranged on a base substrate 100. A gate insulation layer 110 and a passivation layer 120 are arranged sequentially on the signal lines. The gate signal line 210 is formed through a patterning process while forming a gate electrode of a TFT switch at a display region. In FIG. 1, A represents a cutting direction, and B-B represents a movement direction of the debris generated during the cutting operation. Because the gate insulation layer 110 and the passivation layer 120 on the signal lines 200 are of insufficient strength, the signal lines 200 may probably be scratched or cut-off by the debris.

Figure 2:
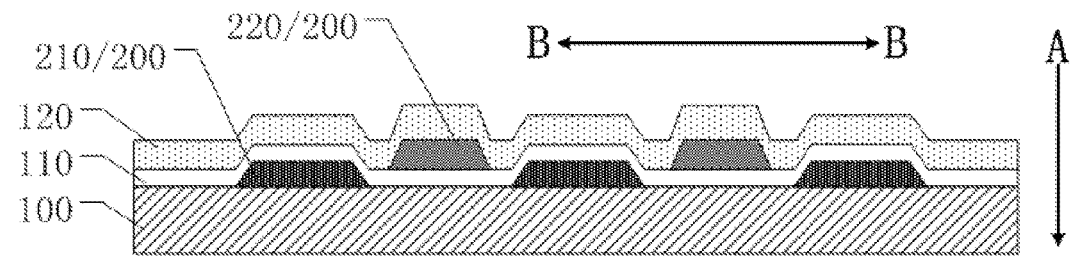
FIG. 2 is another sectional view of the wiring region of the display substrate in the related art.

As shown in FIG. 2 which is another sectional view of the wiring region of the display substrate in the related art, the signal lines 200 may be arranged at two layers, e.g., they may include the gate signal lines 210 and data signal lines 220 on the base substrate 100. The gate insulation layer 110 and the passivation layer 120 are arranged on the gate signal lines 210, and the passivation layer 120 is arranged on the data signal lines 220. Because the gate insulation layer 110 is arranged between the data signal lines 220 and the gate signal lines 210, a height of each data signal line 220 on the base substrate 100 is usually greater than a height of the gate signal line 210 by, e.g., about 220 nm. The gate signal line 210 is formed through a patterning process while forming the source/drain electrode layer of the TFT switch at the display region. In FIG. 2, A represents the cutting direction, and B-B represents the movement direction of the debris generated during the cutting operation. The gate insulation layer 110 and the passivation layer 120 on the signal lines 200 are of insufficient strength, the data signal line 220 is arranged at a level higher than the gate signal line 210, and merely the passivation layer 120 is arranged on the data signal line 220, so the signal lines 200, especially the data signal lines 220, may probably be scratched.

It should be appreciated that, the so-called height is measured with the base substrate as a reference. A height of a member refers to a vertical distance between a surface of the member away from the base substrate and the base substrate, rather than a thickness of the member. Taking the data signal line 220 in FIG. 2 as an example, its height is the vertical distance between a surface of the data signal line 220 away from the base substrate 100 and the base substrate 100, and in this case, its height is a sum of a thickness of the gate insulation layer 110 and a thickness of the data signal line.

An object of the present disclosure is to provide a display substrate, a manufacturing method thereof and a display panel, so as to overcome the above-mentioned defects. The display substrate includes a base substrate, a display region arranged on the base substrate, and a wiring region surrounding the display region. The wiring region includes at least one signal line and at least one dummy line arranged along the signal line. A distance between a surface of the dummy line away from the base substrate and the base substrate is greater than a distance between a surface of the signal line away from the base substrate and the base substrate, i.e., a height of the dummy line on the base substrate is greater than a height of the signal line. During the cutting procedure, because the dummy line is arranged along the signal line and has a height greater than the signal line, the dummy line may be scratched by the resultant debris at first, and even in the case that the kinetic energy of the debris is released subsequently, it is still able to protect the signal line.

Figure 3:
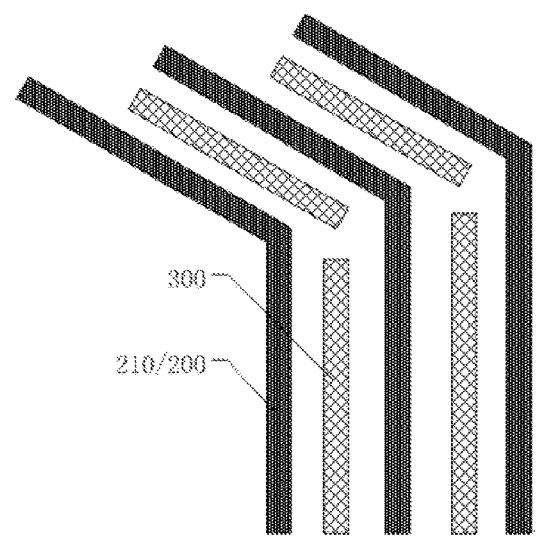
FIG. 3 is a top view of a wiring region of a display substrate in some embodiments of the present disclosure.

As shown in FIG. 3 which is a top view of the wiring region of the display substrate, the wiring region includes at least one signal line 200 (e.g., a gate signal line 210) and at least one dummy line 300 arranged along the signal line 200. The dummy line 300 may be arranged between two adjacent signal lines 200 and have a height greater than the signal line 200. In this way, the dummy line 300 may be cut at first.

In the case of being arranged along the signal line, the dummy line may be, but not limited to, arranged parallel to the signal line. For example, it may include a plurality of segments each arranged along the signal line and crossing the signal line, or it may be of cylindrical structure arranged on the signal line or between the adjacent signal lines in a multi-point distribution manner. In addition, apart from the segments, the dummy line may also be distributed as a continuous line or dots. It is able for the dummy line to protect the adjacent signal line as long as the dummy line is arranged in proximity to the signal line and has a height greater than the adjacent signal line.

Optionally, at least a portion of at least one of the signal lines is provided with at least two branch lines, first end portions of the branch lines are connected to each other, second end portions of the branch lines are connected to each other, portions of the branch lines apart from the end portions are spaced apart from each other, and at least a portion of each dummy line is arranged between two adjacent branch lines. For example, the signal line has two branch lines, first ends of the two branch lines (i.e., a bifurcation point where the signal line is divided into the two branch lines) are connected to each other, and second ends of the two branch lines (i.e., a merge point where the two branch lines are merged into the signal line) are connected to each other. Apart from the ends, the other portions of the branch lines are separated from each other, and a portion of the dummy line is arranged between the branch lines, so as to protect them.

Figure 4:
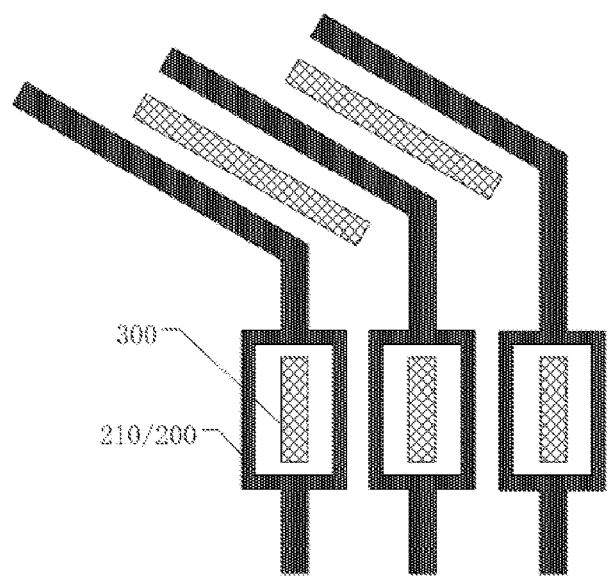
FIG. 4 is another top view of the wiring region of the display substrate in some embodiments of the present disclosure.

As shown in FIG. 4 which is another top view of the wiring region of the display substrate, at least a portion of at least one of the signal lines is provided with at least two branch lines. The portion of the signal line having the branch lines may be of a mouth-shape structure, i.e., the signal line 200 may have two portions arranged at two layers at the mouth-type structure, and a portion of the dummy line 300 may pass through the mouth-type structure. For example, the mouth-type structure may be arranged at a position where the signal line 200 is to be easily cut, and after one branch line of the signal line 200 has been scratched or cut off, the signal line 200 may still work due to the other branch line. After the position where the signal line 200 is to be easily cut, apart from the mouth-type structure in FIG. 4, the signal line 200 may also be widened, and a portion of the dummy line 300 may be arranged on the widened signal line 200, so as to protect the signal line 200.

It should be appreciated that, in the case that the signal line includes two branch lines, the mouth-type structure may be a square or circular structure, and it is able for the dummy line to protect the portion of the signal line as long as the mouth-type structure has at least two branch lines arranged in parallel and a portion of the dummy line passes through the mouth-type structure.

It should be appreciated that, in FIGS. 3 and 4, the signal lines are arranged at an identical layer, i.e., merely the gate signal lines are provided. However, in the case that the signal lines are arranged at two layers, i.e., they include the gate signal lines and the data signal lines, the arrangement mode for the signal lines and the dummy lines in FIGS. 3 and 4 may also be applied.

Optionally, the display region includes at least one of a gate electrode layer, an active layer, a source/drain electrode layer and a pixel electrode layer, which are formed on the base substrate through a patterning process.

Optionally, the dummy line is arranged at a layer identical to, and insulated from, at least one of the active layer, the pixel electrode layer and the source/drain electrode layer.

Figure 5:
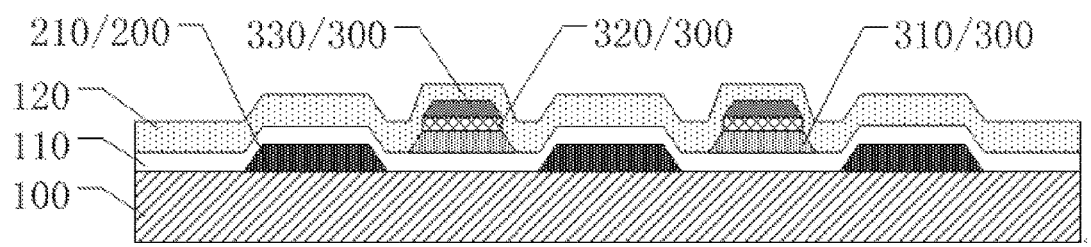
FIG. 5 is a sectional view of the wiring region of the display substrate in some embodiments of the present disclosure.

Optionally, the signal lines may be arranged at an identical layer. As shown in FIG. 5 which is a sectional view of the wiring region of the display substrate, the signal lines 200 and the dummy lines 300 are arranged sequentially on the base substrate 100. The signal line 200 may be the gate signal line 210 which is formed through a patterning process while forming the gate electrode. The dummy line 300 may be arranged between the adjacent signal lines 200, or on the signal line 200.

Optionally, as shown in FIG. 5, a first dummy line 310 of the dummy lines 300 may be arranged at a layer identical to, and insulated from, the active layer at the display region. For example, the first dummy line 310 may be formed on the base substrate 100 through a patterning process while forming the active layer, and it may be made of a material identical to the active layer.

Optionally, as shown in FIG. 5, a second dummy line 320 of the dummy lines 300 may be arranged at a layer identical to, and insulated from, the pixel electrode layer at the display region. For example, the second dummy line 320 may be formed on the base substrate 100 through a patterning process while forming the pixel electrode layer, and it may be made of a material identical to the pixel electrode layer.

Optionally, as shown in FIG. 5, a third dummy line 330 of the dummy lines 300 may be arranged at a layer identical to, and insulated from, the source/drain electrode layer at the display region. For example, the third dummy line 330 may be formed on the base substrate 100 through a patterning process while forming the source/drain electrode layer, and it may be made of a material identical to the source/drain electrode layer.

It should be appreciated that, in the embodiments of the present disclosure, the dummy lines may include one of the first dummy line, the second dummy line and the third dummy line, or a combination thereof. It is able for the dummy lines to protect the signal lines as long as the dummy line has a height greater than the signal line.

Figure 6A:
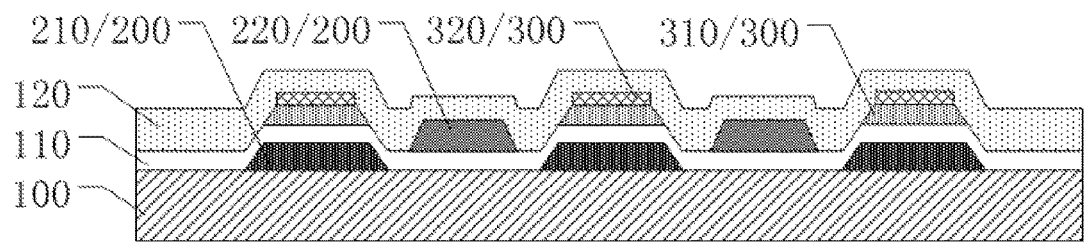
FIG. 6a is another sectional view of the wiring region of the display substrate in some embodiments of the present disclosure.

Optionally, the signal lines are arranged at two layers. As shown in FIG. 6a which is another sectional view of the wiring region of the display substrate, the signal lines 200 and the dummy lines 300 are arranged sequentially on the base substrate 100. The signal lines 200 include the gate signal lines 210 and the data signal lines 220, and they may be formed through a patterning process while forming the gate electrode. The data signal lines 220 may be formed through a patterning process while forming the source/drain electrode layer. Due to the sequence of the formation, the data signal line 220 is usually formed on the gate signal line 210 and between the adjacent gate signal lines 210, and it has a height greater than the gate signal line 210. The dummy line 300 may be arranged on the gate signal line 210, as long as its height is greater than the height of the data signal line 220.

Optionally, as shown in FIG. 6a, the first dummy line 310 of the dummy lines 300 may be arranged at a layer identical to, and insulated from, the active layer at the display region. For example, the first dummy line 310 may be formed on the base substrate 100 through a patterning process while forming the active layer, and it may be made of a material identical to the active layer.

Optionally, as shown in FIG. 6a, the second dummy line 320 of the dummy lines 300 may be arranged at a layer identical to, and insulated from, the pixel electrode layer at the display region. For example, the second dummy line 320 may be formed on the base substrate 100 through a patterning process while forming the pixel electrode layer, and it may be made of a material identical to the pixel electrode layer.

Optionally, the first dummy line of the dummy lines may be made of a material identical to the active layer at the display region. For example, the active layer may be made of amorphous silicon (a-Si), polycrystalline silicon (p-Si), or a metal oxide such as indium gallium zinc oxide (IGZO), indium zinc oxide (IZO), zinc oxide (ZnO) or gallium zinc oxide (GZO).

Optionally, the second dummy line of the dummy lines may be made of a material identical to a pixel electrode at the display region, e.g., a transparent conductive material or a metal material. For example, the pixel electrode may be made of Indium tin oxide (ITO), IZO, indium gallium oxide (IGO), GZO, ZnO, indium oxide ($In_2O_3$), aluminium zinc oxide (AZO) or carbon nanotube.

Optionally, the third dummy line of the dummy lines or the data signal line may be made of a material identical to the source/drain electrode layer at the display region. For example, the source/drain electrode layer may be made of a metal material, and it may have a single-layered structure, e.g., a singled-layered aluminium structure or a single-layered molybdenum structure, or a triple-layered structure, e.g., Mo/Al/Mo.

Optionally, as shown in FIGS. 5 and 6a, the display substrate further includes the insulation layer 110 arranged between the base substrate 100 and the dummy lines 300. The insulation layer 100 may be a gate insulation layer, i.e., the gate insulation layer may be formed on the gate signal lines 210 while forming the gate insulation layer of the TFT at the display region. The gate insulation layer may be made of silicon nitride (SiNx), silicon oxide (SiOx), aluminium oxide ($Al_2O_3$), aluminium nitride (AlN), or any other appropriate material.

Optionally, as shown in FIGS. 5 and 6a, the display substrate may further include the passivation layer 120 arranged on the signal lines 200 and the dummy lines 300. For example, the passivation layer 120 may be made of SiNx or SiOx.

It should be appreciated that, the dummy lines may not be limited to the above combination modes, and any other combination mode may be applied, as long as the dummy line is provided with sufficient strength and has a height greater than signal line.

Figure 6B:
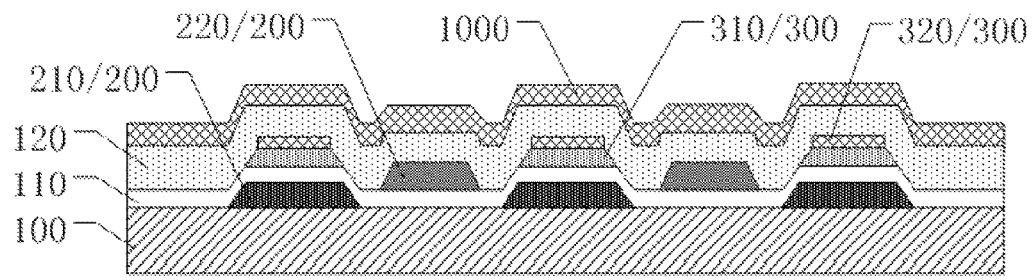
FIG. 6b is yet another schematic view showing the wiring region of the display substrate in some embodiments of the present disclosure.

FIG. 6b is yet another sectional view of the wiring region of the display substrate. In the case that the signal lines are arranged at two layers, as shown in FIG. 6b, an electrode layer 1000 may be arranged on the base substrate with the dummy lines 300 and the signal lines 100. The first dummy line 310, the second dummy line 320 and the electrode layer 1000 may be arranged on the gate signal line 210, and the electrode layer 1000 may be arranged on the data signal line 220. The electrode layer 100 on the gate signal line 210 may be located at a level higher than the electrode layer 1000 on the data signal line 220. In the case that such foreign matters as debris are dropped onto the electrode layer 1000 on the data signal lines 220, they may slide to a higher position, e.g., to the electrode layer 1000 on the gate signal line 210, due to a smooth surface of the electrode layer 1000. At this time, the kinetic energy of the foreign matters may be released at the electrode layer 1000 on the gate signal line 210, and thereby the data signal line 220 may not be damaged.

It should be appreciated that, in the case that the signal lines are arranged at an identical layer, the electrode layer may also be provided so as to protect the signal lines. In addition, apart from being arranged on the dummy lines and the signal lines, the electrode layer may also be arranged merely on the data signal lines, so as to protect the data signal lines. Further, apart from including the first dummy line and the second dummy line, the dummy lines may also include any one of the first dummy line, the second dummy line and the third dummy line, or a combination thereof.

The electrode layer may be made of a transparent conductive material or a metal material. For example, the pixel electrode may be made of ITO, IZO, IGO, GZO, ZnO, $In_2O_3$, AZO or carbon nanotube. In the case that the electrode layer is made of ITO, the electrode layer may be provided with a smooth surface, so that the foreign matters such as the debris may slide along the surface.

Figure 7:
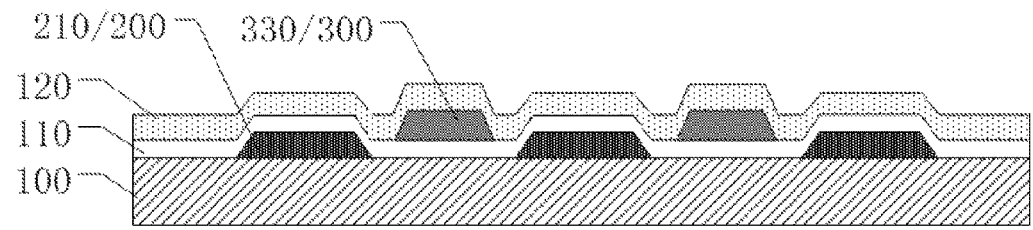
FIG. 7 is still yet another schematic view showing the wiring region of the display substrate in some embodiments of the present disclosure.

Optionally, in the case that the signal lines are arranged at an identical layer, as shown in FIG. 7 which is still yet another sectional view of the wiring region of the display substrate, the dummy lines 300 may merely include the third dummy lines 330 arranged at an identical layer and made of a material identical to the source/drain electrode layer. Due to the sufficient strength, it is able for the third dummy lines 330 to protect the gate signal lines 210.

The dummy lines may be arranged between the adjacent signal lines, or on the signal lines, or both.

Figure 8:
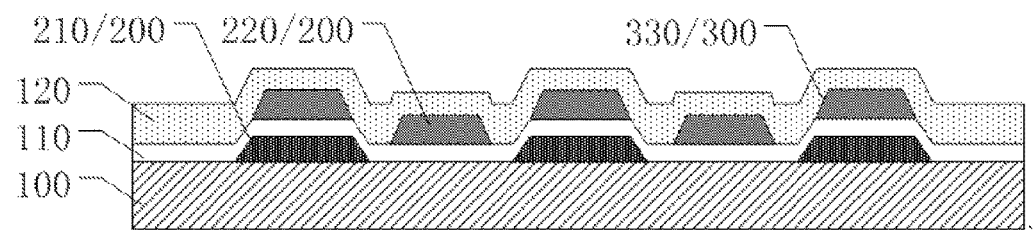
FIG. 8 is still yet another schematic view showing the wiring region of the display substrate in some embodiments of the present disclosure.

Optionally, in the case that the signal lines are arranged at two layers, as shown in FIG. 8 which is still yet another sectional view of the wiring region of the display substrate, the dummy lines 300 may include merely the third dummy lines 330 arranged at an identical layer. The third dummy lines 300 and the data signal lines 220 may be made of a material identical to the source/drain electrode layer, and the third dummy lines 330 may have sufficient strength. The data signal line 220 is arranged between the adjacent gate signal lines 210, and the third dummy line 330 is arranged on the gate signal line 210. The third dummy line 330 has a height greater than the data signal line 220, and the gate signal line 210 is arranged below the third dummy line 330, so it is able for the third dummy line 330 to protect the signal line 200.

In FIG. 8, the dummy lines 300 merely include the third dummy lines 330, and as compared with FIG. 6a, the first dummy lines 310 and the second dummy lines 320 are replaced with the third dummy lines 330. It should be appreciated that, the third dummy lines 330 may also be arranged on the first dummy lines 310 and the second dummy lines 320 in FIG. 6a, and at this time, the dummy lines 300 may include the first dummy lines 310, the second dummy lines 320 and the third dummy lines 330 arranged at three layers.

The present disclosure further provides in some embodiments a method for manufacturing the display substrate. The method includes steps of: providing the base substrate including the display region and the wiring region surrounding the display region; and forming at least one signal line and at least one dummy line sequentially at the wiring region. The dummy line is formed along the signal line, and a distance between a surface of the dummy line away from the base substrate and the base substrate is greater than a distance between a surface of the signal line away from the base substrate and the base substrate.

Optionally, the method further includes forming at least one of the gate electrode layer, the active layer, the source/drain electrode layer and the pixel electrode layer at the display region.

Optionally, the dummy line is arranged at a layer identical to, and formed simultaneously together with, at least one of the active layer, the pixel electrode layer and the source/drain electrode layer.

Optionally, the step of forming the signal line includes forming at least one of the gate signal line arranged at a layer identical to, and electrically connected to, the gate electrode layer and the data signal line arranged at a layer identical to, and electrically connected to, the source/drain electrode layer while forming the gate electrode layer and the source/drain electrode layer.

Optionally, the method further includes forming the insulation layer between the dummy line and the signal line.

Optionally, the dummy line is arranged on the signal line, or between the adjacent signal lines.

According to the embodiments of the present disclosure, the dummy line is arranged at the wiring region of the display substrate at a level higher than the signal line, so as to prevent the signal line from being scratched. In addition, the dummy line may be made of a material identical to, and formed through a patterning process identical to, the other layers of the display substrate (e.g., the layers of the TFT), so it is unnecessary to provide any additional process.

In the embodiments of the present disclosure, the signal lines may be arranged at an identical layer or two layers. For ease of understanding, the manufacture procedure of the display substrate will be described hereinafter in both cases. It should be appreciated that, the combination modes of the dummy lines have been described hereinabove, and it should be appreciated that, any other combination mode of the dummy lines may also be applied.

It should be appreciated that, the signal lines and the dummy lines at the wiring region may be formed simultaneously with the gate electrode, the active layer, the pixel electrode layer and the source/drain electrode layer of the TFT, so in the following description, the manufacture of the layers of the TFT at the display region will not be particularly defined. For example, in the case that a gate electrode layer film is formed on the base substrate, it may be patterned so as to form the gate electrode (at the display region) and the gate signal line (at the wiring region). Here, merely the manufacture of the display substrate at the wiring region is described, so merely the formation of the gate signal line is particularly defined.

In the case that the signal lines are arranged at an identical layer, as shown in FIGS. 9a-9f, the manufacture method of the display substrate will be described as follows.

Figure 9A:
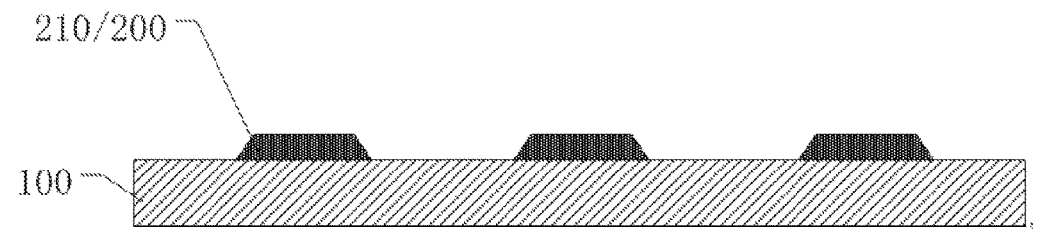
FIGS. 9a to 9f are schematic views showing a method for manufacturing the wiring region of the display substrate in some embodiments of the present disclosure.

As shown in FIG. 9a, the base substrate 100 may be provided, and a gate electrode layer film may be deposited onto the base substrate 100. Then, the gate electrode layer film may be treated through a patterning process, so as to form the signal lines 200, i.e., the gate signal lines 210.

Optionally, the patterning process may be a photoetching process. To be specific, a photoresist may be applied to the gate electrode layer film, and then exposed with a mask plate. Next, the exposed photoresist may be developed so as to acquire a photoresist pattern, and the gate electrode layer film may be etched using the photoresist pattern. Optionally, the remaining photoresist may be removed.

Figure 9B:
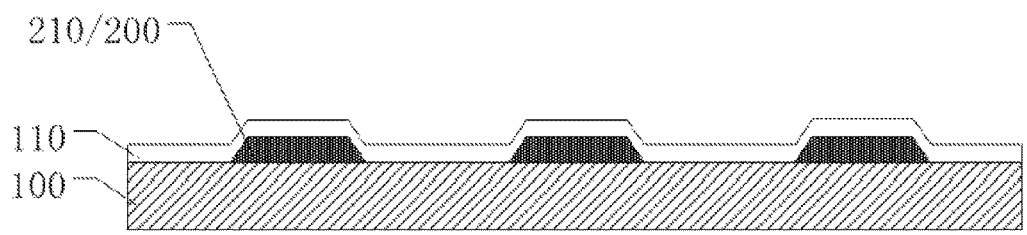

As shown in FIG. 9b, the insulation layer 110 may be deposited onto the base substrate with the gate signal lines 210.

Figure 9C:
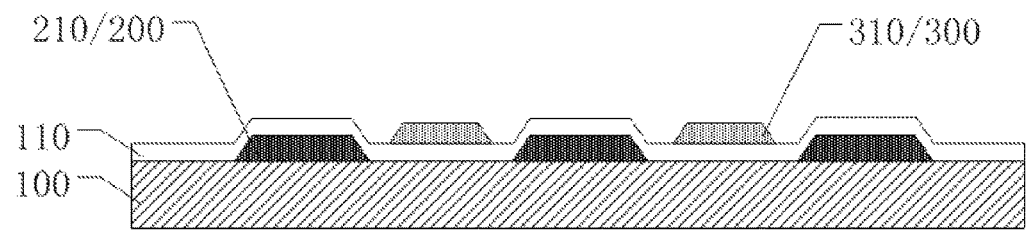

As shown in FIG. 9c, an active layer film may be formed on the insulation layer 110, and then treated through a patterning process so as to form the first dummy line 310. The first dummy line 310 may be arranged between the adjacent gate signal lines 210, or on the gate signal line 210.

Figure 9D:
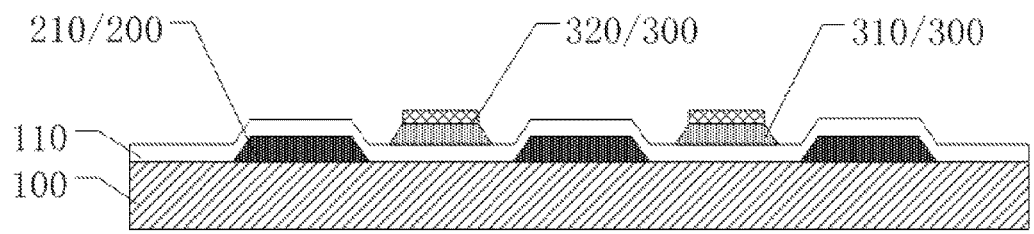

As shown in FIG. 9d, a pixel electrode layer film may be deposited onto the base substrate 100 with the first dummy line 310, and then treated through a patterning process, so as to form the second dummy line 320. The second dummy line 320 may be arranged on the first dummy line 310.

Figure 9E:
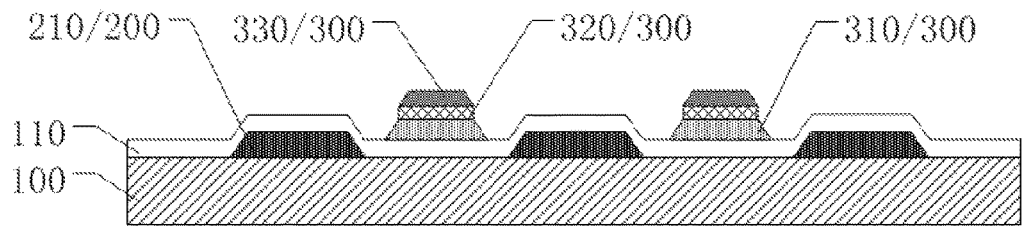

As shown in FIG. 9e, a source/drain electrode layer film may be deposited onto the base substrate with the second dummy line 320, and then treated through a patterning process so as to form the third dummy line 330. The third dummy line 330 may be arranged on the second dummy line 320.

Figure 9F:
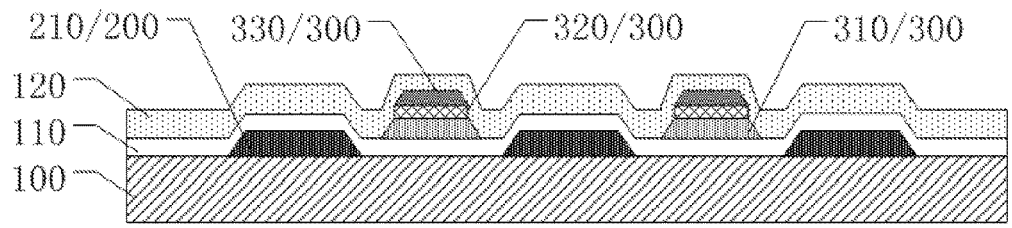

As shown in FIG. 9f, the passivation layer 120 may be deposited onto the base substrate 100 with the third dummy line 330.

In the case that the signal lines are arranged at two layers, as shown in FIGS. 10a-10f, the manufacture method of the display substrate will be described as follows.

Figure 10A:
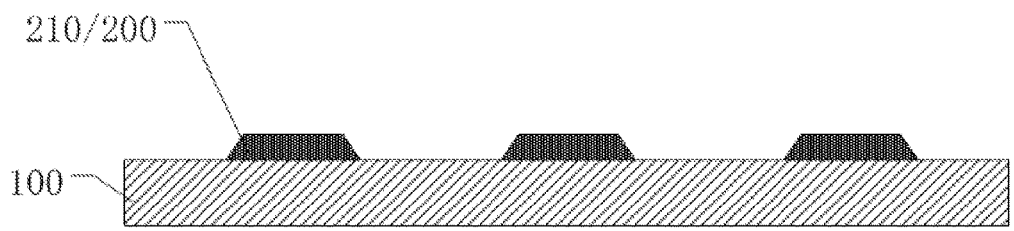
FIGS. 10a to 10f are schematic views showing another method for manufacturing the wiring region of the display substrate in some embodiments of the present disclosure.

As shown in FIG. 10a, the base substrate 100 may be provided, and a gate electrode layer film may be deposited onto the base substrate 100. Then, the gate electrode layer film may be treated through a patterning process, so as to form parts of the signal lines 200 arranged at one layer, i.e., the gate signal lines 210.

Figure 10B:
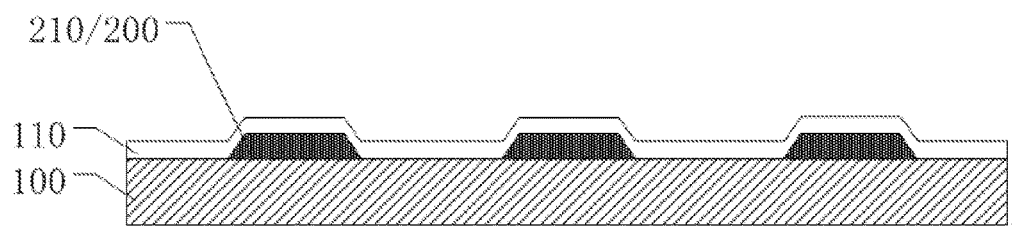

As shown in FIG. 10b, the insulation layer 110 may be deposited onto the base substrate with the gate signal lines 210.

Figure 10C:
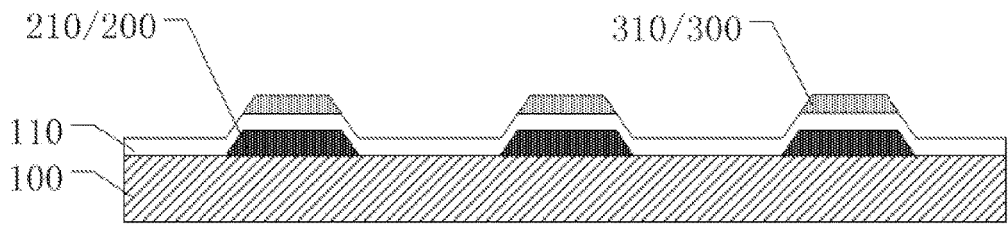

As shown in FIG. 10c, an active layer film may be formed on the insulation layer 110, and then treated through a patterning process so as to form the first dummy line 310. The first dummy line 310 may be arranged on the gate signal line 210.

Figure 10D:
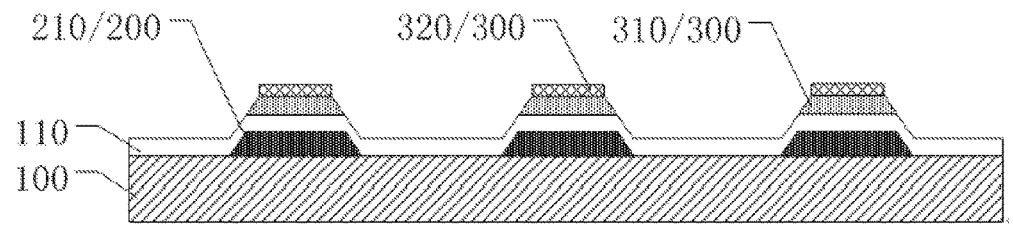

As shown in FIG. 10d, a pixel electrode layer film may be deposited onto the base substrate 100 with the first dummy line 310, and then treated through a patterning process, so as to form the second dummy line 320. The second dummy line 320 may be arranged on the first dummy line 310.

Figure 10E:
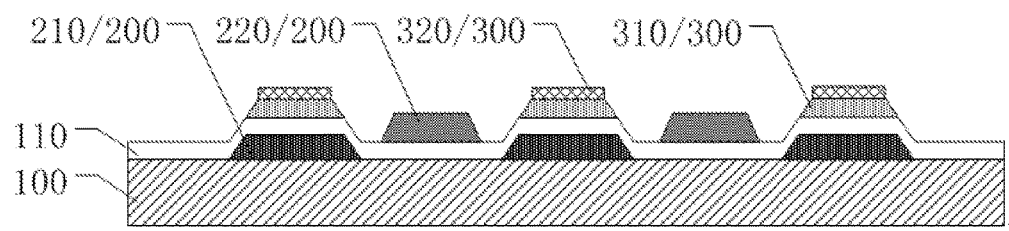

As shown in FIG. 10e, a source/drain electrode layer film may be deposited onto the base substrate 100 with the second dummy line 320, and then treated through a patterning process so as to form the data signal line 220. The data signal line 220 may be arranged between the adjacent gate signal lines 210 and arranged at a layer different from the gate signal lines 210.

Figure 10F:
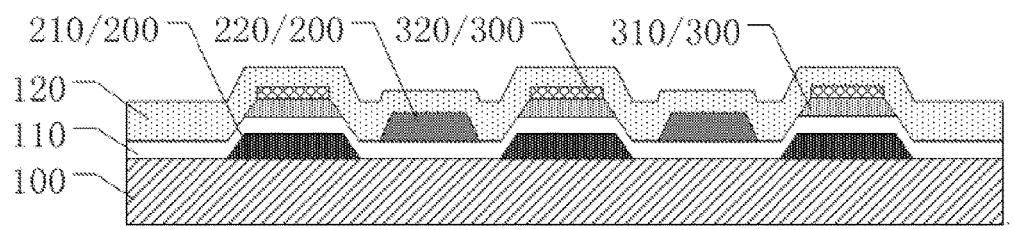

As shown in FIG. 10f, the passivation layer 120 may be deposited onto the base substrate 100 with the data signal line 220.

As mentioned above, the method for manufacturing the display substrate in the embodiments of the present disclosure includes the steps identical to those of the method for manufacturing the display substrate in the related art. As a result, it is able to form the dummy lines for protecting the signal lines without any additional patterning process.

It should be appreciated that, in the embodiments of the present disclosure, the TFT at the display region is of a bottom-gate structure, and the dummy lines are formed in an order identical to the layers of the bottom-gate TFT. Of course, in the case that the TFT is of a top-gate structure, the dummy lines may be formed in an order identical to the layers of the top-gate TFT. In other words, the first dummy line, the second dummy line and the third dummy line are not formed in a fixed order, and the number of the layers thereof is fixed too. It is able for the dummy line to protect the signal line as long as the dummy line has a height greater than the signal line.

The present disclosure further provides in some embodiments a display panel including the above-mentioned display substrate. The display panel further includes a color filter substrate arranged opposite to the display substrate to form a cell. The wiring region is arranged between the base substrate and the color filter substrate, and the color filter substrate is arranged in such a manner as to expose the wiring region after being cut off.

Figure 11:
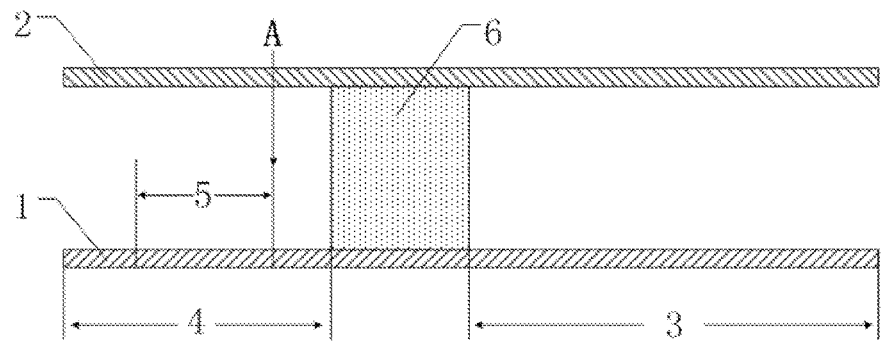
FIG. 11 is a topical, sectional view of a display panel in some embodiments of the present disclosure.

As shown in FIG. 11 which is a topical, sectional view of the display panel, the display panel includes a display substrate 1, a color filter substrate 2 arranged opposite to the display substrate 1 to form a cell, and a sealant 6. The display substrate 1 includes a display region 3 and a peripheral region 4 including a wiring region 5 a region surrounding the wiring region. The sealant 6 is arranged between the display region 3 and the peripheral region 4.

During the manufacture of the display panel, it is necessary to cut off a portion of the color filter substrate 2 along a cutting line A, so as to expose the wiring region 5. However, during the cutting procedure, the cut-off portion of the color filter substrate 2 may be dropped onto the display substrate 1, and meanwhile the debris may occur, so the circuit at the wiring region 5 may easily be scratched. In the embodiments of the present disclosure, due to the dummy lines (not shown) at the wiring region of the display substrate, it is able to protect the circuit, e.g., the signal lines from being scratched, thereby to prevent the occurrence of the defective display effect.

For example, the display panel may be a liquid crystal display panel, which includes the display substrate, the color filter substrate arranged opposite to the display substrate to form a liquid crystal cell, and a liquid crystal material filled within the liquid crystal cell. A pixel electrode of each pixel unit of the display substrate is configured to apply an electric field to the liquid crystal material, so as to control a deflection degree of the liquid crystal material, thereby to display an image.

For another example, the display panel may also be an organic light-emitting diode (OLED) display panel. An organic light-emitting layer is arranged on the display substrate, and a pixel electrode of each pixel unit functions as an anode or a cathode, so as to drive the organic light-emitting layer to emit light, thereby to display an image.

For yet another example, the display panel may also be an electronic paper display panel. An electronic ink layer is formed on the display substrate, and a pixel electrode of each pixel unit is configured to apply a voltage, so as to drive charged particles in electronic ink to move, thereby to display an image.

It should be appreciated that, (1) the drawings in the embodiments of the present disclosure merely refer to the necessary structures, and any other structure may refer to a common design. (2) For clarification, the thicknesses of the layers or regions in the drawings are zoomed in or out, i.e., the drawings are not used to reflect an actual scale. (3) In the case of no conflict, the embodiments of the present disclosure and the features therein may be combined in any form to acquire new embodiments.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, a display region on the base substrate and a wiring region surrounding the display region, wherein the wiring region comprises at least one signal line and at least one dummy line, and a distance between a surface of the dummy line away from the base substrate and the base substrate is greater than a distance between a surface of the signal line away from the base substrate and the base substrate;
   wherein the display region comprises at least one of a gate electrode layer, an active layer, a source/drain electrode layer and a pixel electrode layer on the base substrate;
   wherein the dummy line is arranged at a layer identical to, and insulated from, at least one of the active layer, the pixel electrode layer and the source/drain electrode layer;
   wherein the signal line comprises at least one of a gate signal line arranged at a layer identical to: and electrically connected to: the gate electrode layer: and a data signal line arranged at a layer identical to: and electrically connected to: the source/drain electrode layer; and
   wherein an orthogonal projection of the data signal line onto the base substrate is located between orthogonal projections of adjacent gate signal lines onto the base substrate:
   the display substrate further comprising:
   an insulation layer between the dummy line and the gate signal line:
   a passivation layer arranged on the insulation layer: the dummy line and the data signal line, and
   an electrode layer arranged on the passivation layer: wherein a distance between a surface of the electrode layer above the gate signal line away from the base substrate and the base substrate is greater than a distance between a surface of the electrode layer above the data signal line away from the base substrate and the base substrate.

2. The display substrate according to claim 1, wherein an orthogonal projection of the dummy line onto the base substrate at least partially overlaps an orthogonal projection of the signal line onto the base substrate.

3. The display substrate according to claim 1, wherein at least a portion of at least one of the signal lines is provided with at least two branch lines, first end portions of the branch lines are connected to each other, second end portions of the branch lines are connected to each other, portions of the branch lines apart from the first and the second end portions are spaced apart from each other, and at least a portion of each dummy line is arranged between two adjacent branch lines.

4. The display substrate according to claim 1, further comprising an insulation layer arranged between the dummy line and the signal line.

5. The display substrate according to claim 1, wherein the wiring region comprises a plurality of signal lines, and the orthogonal projection of each dummy line onto the base substrate is located between orthogonal projections of two adjacent signal lines onto the base substrate.

6. The display substrate according to claim 1, wherein the orthogonal projection of each dummy line onto the base substrate at least partially overlaps the orthogonal projection of the gate signal line onto the base substrate, and the orthogonal projection of each dummy line onto the base substrate is located between the orthogonal projections of the adjacent data signal lines onto the base substrate.

7. The display substrate according to claim 3, wherein at least a portion of at least one of the signal lines is provided with two branch lines connected in parallel, and orthogonal projections of the two branch lines onto the base substrate surround an orthogonal projection of at least a portion of the dummy line onto the base substrate.

8. A display panel comprising the display substrate according to claim 1.

9. A method for manufacturing a display substrate, comprising:
   providing a base substrate including a display region and a wiring region surrounding the display region;
   forming at least one signal line and at least one dummy line sequentially at the wiring region,
   wherein the dummy line is formed along the signal line, and a distance between a surface of the dummy line away from the base substrate and the base substrate is greater than a distance between a surface of the signal line away from the base substrate and the base substrate;
   wherein the method further comprises: forming at least one of a gate electrode layer, an active layer, a source/drain electrode layer and a pixel electrode layer at the display region; and
   the dummy line is arranged at a layer identical to, and formed simultaneously together with, at least one of the active layer, the pixel electrode layer and the source/drain electrode layer;
   forming an insulation layer between the dummy line and the signal line;
   forming a passivation layer arranged on the insulation layer, the dummy line and a data signal line, and
   forming an electrode layer arranged on the passivation layer: wherein a distance between a surface of the electrode layer above the signal line away from the base substrate and the base substrate is greater than a distance between a surface of the electrode layer above the data signal line away from the base substrate and the base substrate.

10. The method according to claim 9, wherein an orthogonal projection of the dummy line onto the base substrate at least partially overlaps an orthogonal projection of the signal line onto the base substrate.

11. The method according to claim 9, wherein the forming the signal line comprises forming at least one of a gate signal line arranged at a layer identical to, and electrically connected to, the gate electrode layer and a data signal line arranged at a layer identical to, and electrically connected to, the source/drain electrode layer while forming the gate electrode layer and the source/drain electrode layer.

12. The method according to claim 9, wherein the wiring region comprises a plurality of signal lines, and the orthogonal projection of the dummy line onto the base substrate is located between orthogonal projections of the adjacent signal lines onto the base substrate.

13. A display substrate, comprising a base substrate, a display region on the base substrate and a wiring region surrounding the display region, wherein the wiring region comprises at least one signal line and at least one dummy line, and a distance between a surface of the dummy line away from the base substrate and the base substrate is greater than a distance between a surface of the signal line away from the base substrate and the base substrate;

wherein the display region comprises at least one of a gate electrode layer, an active layer, a source/drain electrode layer and a pixel electrode layer on the base substrate;

the signal line comprises at least one of a gate signal line arranged at a layer identical to, and electrically connected to, the gate electrode layer, and a data signal line arranged at a layer identical to, and electrically connected to, the source/drain electrode layer;

an orthogonal projection of the data signal line onto the base substrate is located between orthogonal projections of adjacent gate signal lines onto the base substrate;

wherein the display substrate further comprises an insulation layer between the dummy line and the gate signal line, a passivation layer arranged on the insulation layer, the dummy line and the data signal line, and an electrode layer arranged on the passivation layer, wherein a distance between a surface of the electrode layer above the gate signal line away from the base substrate and the base substrate is greater than a distance between a surface of the electrode layer above the data signal line away from the base substrate and the base substrate.

\* \* \* \* \*